United States Patent
Bi et al.

(10) Patent No.: US 11,022,891 B2
(45) Date of Patent: Jun. 1, 2021

(54) PHOTORESIST BRIDGING DEFECT REMOVAL BY REVERSE TONE WEAK DEVELOPER

(71) Applicant: INTERNATIONAL BUSINESS MACHINES CORPORATION, Armonk, NY (US)

(72) Inventors: Zhenxing Bi, Niskayuna, NY (US); Karen E. Petrillo, Voorheesville, NY (US); Nicole A. Saulnier, Albany, NY (US); Hao Tang, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/800,786

(22) Filed: Nov. 1, 2017

(65) Prior Publication Data

US 2018/0239254 A1 Aug. 23, 2018

Related U.S. Application Data

(63) Continuation of application No. 15/440,198, filed on Feb. 23, 2017.

(51) Int. Cl.
*G03F 7/32* (2006.01)
*G03F 7/40* (2006.01)

(52) U.S. Cl.
CPC ............. *G03F 7/322* (2013.01); *G03F 7/325* (2013.01); *G03F 7/40* (2013.01)

(58) Field of Classification Search
CPC ................................. G03F 7/322; G03F 7/325
See application file for complete search history.

(56) References Cited

U.S. PATENT DOCUMENTS

| | | | |
|---|---|---|---|
| 4,370,406 A | 1/1983 | Jones | |
| 4,587,203 A * | 5/1986 | Brault | G03F 7/325 427/372.2 |
| 4,868,241 A * | 9/1989 | Hiscock | G03F 7/0388 525/59 |
| 5,897,982 A * | 4/1999 | Shibata | G03F 7/3021 430/311 |
| 6,248,502 B1 | 6/2001 | Eklund | |
| 6,352,818 B1 | 3/2002 | Hsieh | |
| 6,372,408 B1 | 4/2002 | Lu et al. | |
| 6,451,510 B1 | 9/2002 | Messick et al. | |
| 8,748,074 B2 | 6/2014 | Onishi et al. | |
| 8,836,082 B2 | 9/2014 | Lin et al. | |
| 9,328,179 B2 | 5/2016 | Rhodes et al. | |
| 2011/0165523 A1* | 7/2011 | Wang | G03F 7/422 430/331 |
| 2011/0287234 A1* | 11/2011 | Tsuchihashi | G03F 7/0382 428/195.1 |
| 2012/0164390 A1 | 6/2012 | Washburn et al. | |
| 2014/0017616 A1* | 1/2014 | Chang | G03F 7/30 430/325 |
| 2015/0309411 A1 | 10/2015 | Hwang et al. | |
| 2016/0033870 A1* | 2/2016 | Nakamura | G03F 7/38 428/156 |
| 2016/0056049 A1 | 2/2016 | Lin | |

OTHER PUBLICATIONS

List of IBM Patents or Patent Applications Treated as Related dated Nov. 1, 2017, 2 pages.

* cited by examiner

*Primary Examiner* — Daborah Chacko-Davis
(74) *Attorney, Agent, or Firm* — Tutunjian & Bitetto, P.C.; Vazken Alexanian

(57) ABSTRACT

A method for removing photoresist bridging defects includes coating a photoresist layer over a dielectric layer formed over a substrate, applying a first developer that results in formation of one or more photoresist bridging defects, and applying a second developer to remove the one or more photoresist bridging defects. The first developer is an aqueous base developer and the second developer is a reverse tone weak developer (RTWD), the RTWD being a mixture of a first (good) solvent and a second (bad) solvent for the photoresist.

2 Claims, 2 Drawing Sheets

PHOTORESIST BRIDGING DEFECT REMOVAL BY REVERSE TONE WEAK DEVELOPER

BACKGROUND

Technical Field

The present invention relates generally to methods of removal of micro-bridging defects in a resist pattern during fabrication.

Description of the Related Art

During the semiconductor patterning process it is common for micro-bridging defects to occur. It is particularly common for micro-bridging defects to form in the resist patterns after the lithography process in advanced technology nodes, for example, nodes of approximately 32 nm and beyond. Micro-bridging defects include small connections between two adjacent lines in a photo-resist pattern, which can cross-link two or more resist patterns in close proximity leading to the creation of single-line opens after etching. The cross-linking of the resist patterns of micro-bridging defects can cause a decrease in the production yield of advanced integrated circuits.

SUMMARY

In accordance with an embodiment, a method is provided for removing photoresist bridging defects. The method includes coating a photoresist layer over a dielectric layer formed over a substrate, applying a first developer that results in formation of one or more photoresist bridging defects, and applying a second developer to remove the one or more photoresist bridging defects.

In accordance with an embodiment, a method is provided for removing photoresist bridging defects. The method includes forming a photoresist layer over a substrate, applying an aqueous base developer that results in formation of at least one photoresist bridging defect, and applying a reverse tone weak developer (RTWD) to remove the at least one photoresist bridging defect.

In accordance with an embodiment, a semiconductor structure is provided. The semiconductor structure includes a photoresist layer coated over a dielectric layer formed over a substrate, a first developer applied over the photoresist layer resulting in formation of one or more photoresist bridging defects, and a second developer applied over the photoresist layer to remove the one or more photoresist bridging defects.

It should be noted that the exemplary embodiments are described with reference to different subject-matters. In particular, some embodiments are described with reference to method type claims whereas other embodiments have been described with reference to apparatus type claims. However, a person skilled in the art will gather from the above and the following description that, unless otherwise notified, in addition to any combination of features belonging to one type of subject-matter, also any combination between features relating to different subject-matters, in particular, between features of the method type claims, and features of the apparatus type claims, is considered as to be described within this document.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The invention will provide details in the following description of preferred embodiments with reference to the following figures wherein.

Throughout the drawings, same or similar reference numerals represent the same or similar elements.

DETAILED DESCRIPTION

Figure 1:
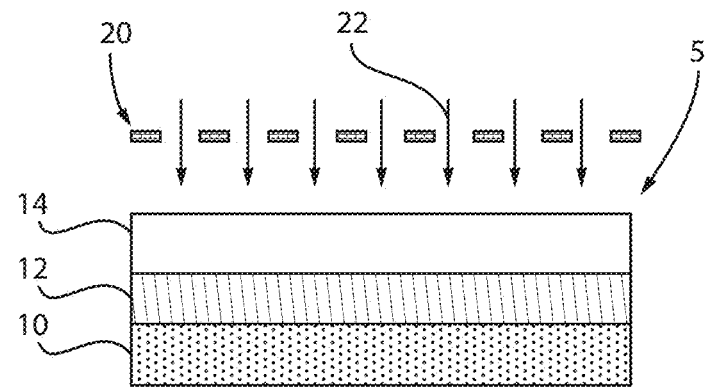
FIG. 1 is a cross-sectional view of a semiconductor substrate, where a photoresist layer is coated on the substrate, and the photoresist is exposed under deep ultraviolet (DUV) or extreme ultraviolet (EUV) light, with a transmissive or reflective photomask, in accordance with the present invention.

In one or more embodiments, a method is provided for removing photoresist bridging defects. The method includes coating a photoresist layer over a dielectric layer formed over a substrate, applying a first developer that results in formation of one or more photoresist bridging defects, and applying a second developer to remove the one or more photoresist bridging defects.

In one or more embodiments, a method is provided for removing photoresist bridging defects. The method includes forming a photoresist layer over a substrate, applying an aqueous base developer that results in formation of at least one photoresist bridging defect, and applying a reverse tone weak developer (RTWD) to remove the at least one photoresist bridging defect.

In one or more embodiments, a semiconductor structure is provided. The semiconductor structure includes a photoresist layer coated over a dielectric layer formed over a substrate, a first developer applied over the photoresist layer resulting in formation of one or more photoresist bridging defects, and a second developer applied over the photoresist layer to remove the one or more photoresist bridging defects.

In one or more embodiments, the RTWD is a mixture of a good solvent for the photoresist (e.g., GBL, gamma-butyrolactone) and a bad solvent for the photoresist (e.g., MIBC, methyl isobutyl carbinol). In one or more embodiments, because the polymer in the micro bridging region differs in constituents, a proper organic solvent can selectively dissolve the micro bridge but not the rest of photoresist. The proper organic solvent is called reverse tone weak developer (RTWD) because (i) the second developer rinse uses negative tone organic solvent, its polarity being opposite to the polarity of the first developer, which is a positive tone aqueous base and (ii) the organic solvent is diluted by a bad solvent so that it dissolves the unexposed photoresist very slowly, hence a weak developer.

As used herein, "semiconductor device" refers to an intrinsic semiconductor material that has been doped, that is, into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor.

The term "direct contact" or "directly on" means that a first element, such as a first structure, and a second element, such as a second structure, are connected without any intermediary conducting, insulating or semiconductor layers at the interface of the two elements.

The terms "overlying", "atop", "positioned on" or "positioned atop" means that a first element, such as a first structure, is present on a second element, such as a second structure, wherein intervening elements, such as an interface structure can be present between the first element and the second element.

The term "electrically connected" means either directly electrically connected, or indirectly electrically connected, such that intervening elements are present; in an indirect electrical connection, the intervening elements can include inductors and/or transformers.

The term "crystalline material" means any material that is single-crystalline, multi-crystalline, or polycrystalline.

The term "non-crystalline material" means any material that is not crystalline; including any material that is amorphous, nano-crystalline, or micro-crystalline.

The term "intrinsic material" means a semiconductor material which is substantially free of doping atoms, or in which the concentration of dopant atoms is less than $10^{15}$ atoms/cm$^3$.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

The word "exemplary" is used herein to mean "serving as an example, instance, or illustration." Any embodiment described herein as "exemplary" is not necessarily to be construed as preferred or advantageous over other embodiments. Likewise, the term "embodiments of the invention" does not require that all embodiments of the invention include the discussed feature, advantage or mode of operation.

It is to be understood that the present invention will be described in terms of a given illustrative architecture; however, other architectures, structures, substrate materials and process features and steps/blocks can be varied within the scope of the present invention. It should be noted that certain features cannot be shown in all figures for the sake of clarity. This is not intended to be interpreted as a limitation of any particular embodiment, or illustration, or scope of the claims.

Various illustrative embodiments of the invention are described below. In the interest of clarity, not all features of an actual implementation are described in this specification.

It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this invention.

The present subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 is a cross-sectional view of a semiconductor substrate, where a photoresist layer is coated on the substrate, and the photoresist is exposed under deep ultraviolet (DUV) or extreme ultraviolet (EUV) light, with a transmissive or reflective mask, in accordance with the present invention.

In various embodiments, a semiconductor structure 5 includes a photoresist layer 14 coated over a dielectric layer 12, which is formed over a substrate 10. A light 22 can be applied to the photoresist layer 14 through a mask 20 positioned over the photoresist layer 14.

In one or more embodiments, the substrate 10 can be a semiconductor or an insulator with an active surface semiconductor layer. The substrate 10 can be crystalline, semi-crystalline, microcrystalline, or amorphous. The substrate 10 can be essentially (i.e., except for contaminants) a single element (e.g., silicon), primarily (i.e., with doping) of a single element, for example, silicon (Si) or germanium (Ge), or the substrate 10 can include a compound, for example, Al$_2$O$_3$, SiO$_2$, GaAs, SiC, or SiGe. The substrate 10 can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI). The substrate 10 can also have other layers forming the substrate 10, including high-k oxides and/or nitrides. In one or more embodiments, the substrate 10 can be a silicon wafer. In an embodiment, the substrate 10 is a single crystal silicon wafer.

In one or more embodiments, the dielectric layer 12 can be an organic planarization layer (OPL), a bottom anti-reflection coating (BARC), a silicon oxide or other silicon/metal oxides, a silicon nitride or other silicon/metal nitrides, a tetraethyl orthosilicate or other silicates, or any combination of these layers.

The dielectric layer 12 can be formed utilizing a deposition process such as, for example, spin-on, CVD, PECVD, evaporation, chemical solution deposition and other like deposition techniques.

In various embodiments, the materials and layers can be deposited by physical vapor deposition (PVD), chemical vapor deposition (CVD), atomic layer deposition (ALD), molecular beam epitaxy (MBE), or any of the various modifications thereof, for example plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PE-ALD). The depositions can be epitaxial processes, and the deposited material can be crystalline. In various embodiments, formation of a layer can be by one or more deposition processes, where, for example, a conformal layer can be formed by a first process (e.g., ALD, PE-ALD, etc.) and a fill can be formed by a second process (e.g., CVD, electrodeposition, PVD, etc.).

The thickness of the dielectric layer 12 can vary for different applications. In one embodiment, the dielectric layer 12 has a thickness from 5 nm to 50 nm. In another embodiment, the dielectric layer 12 has a thickness from 30 nm to 90 nm. In yet another embodiment, the dielectric layer 12 has a thickness from 600 nm to 3000 nm.

The dielectric layer 12 can be referred to as a cutting mask or a blocking mask. The mask 12 provides robust removal of extraneous (or, undesired) features added to the first exposure's mask layout. It is understood that as used herein, the terms "extraneous features" and "undesired features" can be used interchangeably to describe features produced in a layout (e.g., due to printing) that are not desirable in the final layout, and also violate certain dimensional constraints (e.g., tolerances). In some cases, these extraneous features can be identified during simulation, prior to formation of the mask 12. In some cases, these extraneous features can exist at the outer contour of a process variation band (e.g., those outermost process variations). In some cases, these extraneous features can exist due to exposure variations and/or interfering light waveforms (e.g., via constructive interference) that create undesired features (e.g., features) on an underlying target. The mask 12 can then be designed in order to remove these extraneous features from the final layout.

A BARC (buried ARC or back ARC) refers to an anti-reflective coating which is typically used during a photolithography process of the kind commonly used to pattern layers in a semiconductor device. Often, the BARC is a "hard" layer of anti-reflective material which is applied directly over the surface of a layer which is to be patterned. Overlying the BARC is a photoresist which is processed to provide a pattern in the photoresist layer 14. A plasma etching process is typically used to transfer the pattern from the photoresist layer 14 through the BARC layer 12, and to other layers underlying the BARC layer 12.

The photoresist can be patterned by using imaging radiation, and the BARC reduces radiation reflection back from surfaces underlying the BARC (the reflected radiation deteriorates the pattern image in the photoresist).

The photoresist is typically a "soft" organic material. The BARC can be an inorganic material, but can also be a "hard," high molecular weight organic material in some instances. Often the BARC has a chemical structure which not only stops the backward reflection of radiation, but also provides functionality as a hard masking material during transfer of the pattern to surfaces underlying the BARC. In many instances, the surface directly underlying the BARC is a low k dielectric material.

To perform the dual function of anti-reflective coating and hard mask, the chemical composition of a BARC layer is substantially different from that of a photoresist layer, and the techniques used to remove a photoresist layer (oxygen plasma, sulfuric acid-hydrogen peroxide mixture, organic solvents, ozone water, amine-based and hydroxide-based solutions, for example) are either not effective in removing a typical BARC layer or would cause damage to commonly used low k dielectric layers underlying the BARC layer.

Two types of BARC layers are commonly used by the semiconductor industry. Spin-on BARCs are typically organic materials applied as a liquid formulation to the semiconductor substrate from a spin-coating station (track). After the BARC film is formed, a high temperature bake (post-apply bake) is used to remove the casting solvent and to crosslink the polymer components, so as to form a BARC layer that is impervious to the casting solvent used in the photoresist formulation that is coated subsequently. In this case, the optical properties are defined by the chemical functionality of the polymer components present in the formulation.

Alternatively, BARCs deposited through radiation assisted techniques such as chemical vapor deposition (CVD), high density plasma, sputtering, ion beam or electron beam are typically inorganic or hybrid materials (e.g. silicon nitrides, silicon oxynitrides, hydrogenated silicon carboxynitrides, or combinations thereof) that are applied from a gas phase in a stand-alone deposition chamber, utilizing precursors capable of being volatilized, combined with gaseous co-reactants and converted to their corresponding hybrid or inorganic derivatives at high temperatures or assisted by plasma conditions. In this case, the chemical nature of the precursors and the reactant concentration ratios define the net chemical composition and the optical properties of the deposited BARC layer.

The photoresist layer 14 is exposed to light 22 through a mask 20 typically placed over the photoresist layer 14 containing clear and opaque features such that a region of the photoresist layer 14 is exposed to light while other regions of the photoresist layer 14 are not exposed to light, in this case drawn to reflect a positive-tone photoresist. The BARC layer 12 (or OPL layer) ensures that a substantial portion of light that passes through the photoresist layer 14 is absorbed by the BARC layer 12 without being reflected back to the photoresist layer 14 by any layer(s) beneath the BARC layer 12.

In one embodiment, it is assumed that positive-tone optical lithography is used. In other words, the photoresist layer 14 comprises a positive-tone photoresist material such that regions of the photoresist layer 14 exposed to light change from originally insoluble to soluble in a first photoresist developer (a solvent) while other regions of the photoresist layer 14 not exposed to light remain insoluble in the first photoresist developer. As a result, in one embodiment, the first photoresist developer is used to develop away (remove) the exposed-to-light regions of the photoresist layer 14 (called development process) resulting in a photoresist hole (not shown) in the patterned photoresist layer 14 which exposes a top BARC surface of the BARC layer 12 to the surrounding ambient light.

Photolithography is a process which uses light to transfer a geometric pattern from a photomask to a substrate such as a silicon wafer. In a photolithography process, a photoresist layer is first formed on the substrate. The substrate is baked to remove any solvent remained in the photoresist layer. The photoresist is then exposed through a photomask with a desired pattern to a source of actinic radiation. The radiation exposure causes a chemical reaction in the exposed areas of the photoresist and creates a latent image corresponding to the mask pattern in the photoresist layer. The photoresist is next developed in a developer solution, usually an aqueous base solution, to form a pattern in the photoresist layer. The patterned photoresist can then be used as a mask for subsequent fabrication processes on the substrate, such as deposition, etching, or ion implantation processes.

The etching can include a dry etching process such as, for example, reactive ion etching, plasma etching, ion etching or laser ablation. The etching can further include a wet chemical etching process in which one or more chemical etchants are used to remove portions of the blanket layers that are not protected by the patterned photoresist. The patterned photoresist can be removed utilizing an ashing process.

As used herein, the term "selective" in reference to a material removal process denotes that the rate of material removal for a first material is greater than the rate of removal for at least another material of the structure to which the material removal process is being applied. For example, in one embodiment, a selective etch can include an etch chemistry that removes a first material selectively to a second material by a ratio of 10:1 or greater, e.g., 100:1 or greater, or 1000:1 or greater.

The etching of the photoresist layer 14 can be accomplished by, e.g., RIE.

RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used at this point of the present invention include ion beam etching, plasma etching or laser ablation.

There are two types of photoresist: positive resist and negative resist. A positive resist is initially insoluble in the developer solution. After exposure, the exposed region of the resist becomes soluble in the developer solution and is then selectively removed by the developer solution during the subsequent development step. The unexposed region of the positive resist remains on the substrate to form a pattern in the photoresist layer. The selective removal of the exposed region of a photoresist is thus called "positive development."

A negative resist behaves in the opposite manner. The negative resist is initially soluble in the developer solution. Exposure to radiation typically initiates a crosslinking reaction which causes the exposed region of the negative resist to become insoluble in the developer solution. During the subsequent development step, the unexposed region of the negative resist is selectively removed by the developer solution, leaving the exposed region on the substrate to form a pattern. Contrary to the "positive development," a "negative development" refers to a process that selectively removes the unexposed region of a photoresist.

Figure 2:
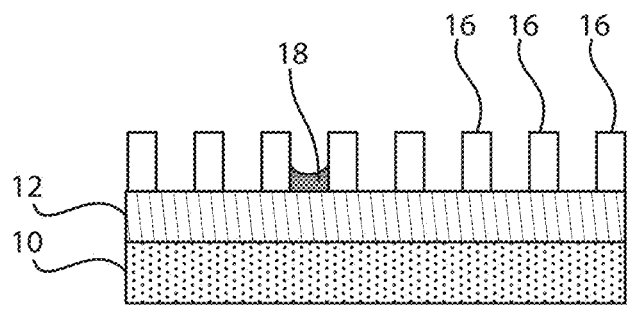
FIG. 2 is a cross-sectional view of the semiconductor device of FIG. 1 where a photoresist bridging defect is present after application of the first developer, in accordance with the present invention.

FIG. 2 is a cross-sectional view of the semiconductor device of FIG. 1 where a photoresist bridging defect is present, in accordance with the present invention.

In various embodiments, the exposed region of photoresist layer 14 is selectively removed by using a first developer. The first developer can be, e.g., an aqueous base developer.

Developing the photoresist layer 14 with the first developer results in the formation of resist lines 16, as well as micro-bridges 18 between the resist lines 16. Microbridging is the spontaneous formation of insoluble residues in unexposed regions. Thus, upon development, resist can remain between nested arrays or in other areas where it should have been removed. These fine bridges between high resolution resist patterns adversely impact on the ability to precisely pattern the substrates. Microbridging is an issue only in sub-micron lithography applications (e.g., when the resolution requirements are on the order of 1-3 µm, microbridging is not a significant issue, but when the resolution requirements on the order of 0.2-0.5 µm, microbridging can become an issue). In advanced DUV lithography or EUV lithography where the resolution is less than 0.1 µm, microbridging can become a significant issue.

During the semiconductor patterning process it is common for micro-bridging defects to occur. It is particularly common for micro-bridging defects to form in the resist patterns after the lithography process in advanced technology nodes, for example, nodes of approximately 32 nm and beyond. Micro-bridging defects include small connections between two adjacent lines in a photo-resist pattern, which can connect two or more resist patterns in close proximity leading to the creation of open or short defects after etching. The open or short defects can cause a decrease in the production yield of advanced integrated circuits.

Figure 3:
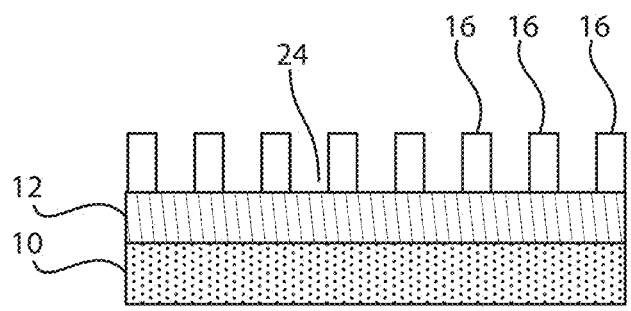
FIG. 3 is a cross-sectional view of the semiconductor device of FIG. 2 where a second developer is applied to the photoresist layer, the second developer being a reverse tone weak developer (RTWD), in accordance with the present invention.

FIG. 3 is a cross-sectional view of the semiconductor device of FIG. 2 where a second developer is applied to the photoresist layer, the second developer being a reverse tone weak developer (RTWD), in accordance with the present invention.

In various embodiments, a second developer is applied to remove the micro-bridges 18, thus exposing the top surface 24 of the layer 12. The second developer can include a developer solvent referred to as a reverse tone weak developer (RTWD). The RTWD is generally a mixture of a good solvent for the photoresist (e.g., GBL, gamma-butyrolactone) and a bad solvent for the resist (e.g., MIBC, methyl isobutyl carbinol). However, the RTWD can also be a single solvent, e.g., 1-butanol, 2-butanol, methylisobutylcarbinol.

Photoresist polymer consists of individual polymer chains of different x,y ratios due to the nature of random radical polymerization. Because the polymer in microbridging region differ in constituents, a proper organic solvent can selectively dissolve the microbridge but not the rest of photoresist.

The proper organic solvent is called reverse tone weak developer because (i) the second developer rinse uses negative tone organic solvent, its polarity being opposite to the polarity of the first developer, which is a positive tone aqueous base and (ii) the organic solvent is diluted by a bad solvent so that it dissolves the unexposed photoresist very slowly, hence a weak developer.

As noted above, RTWD is generally a mixture of organic solvents, one is a good solvent for the photoresist and one is a bad solvent for the photoresist.

The application of the second developer which is a mixture of a good solvent for the photoresist and a bad solvent for the photoresist can be referred to as terms other than RTWD, such as second developer, solvent rinse, defect reduction rinse, or defect reduction treatment, etc.

Good solvents can be, e.g., gamma-butyrolactone, n-butyl acetate, ethyl lactate, ethyl pyruvate; methylisobutylketone, 2-pentanone, 2-hexanone, 2-heptanone, cyclopentanone, cyclohexanone, N-methyl-2-pyrrolidone; propylene glycol monomethyl ether, propylene glycol monomethyl ether acetate, ethyl 3-ethoxy propionate; diethyleneglycoldimethylether, toluene, xylenes, chlorobenze, dichlorobenzes, 1,2,4-triclorobenzene.

Bad solvents can be, e.g., 1-propanol, 2-propanol, 1-butanol, 2-butanol, methylisobutylcarbinol,1-pentanol, amyl alcohol, isoamyl alcohol, or any alchohols having 3 or more carbons; hexanes, heptanes, octanes, nonanes, decanes, or any alkanes having 6 or more carbons.

The RTWD can include other constituents such as surfactants, stabilizers, and co-solvents.

Figure 4:
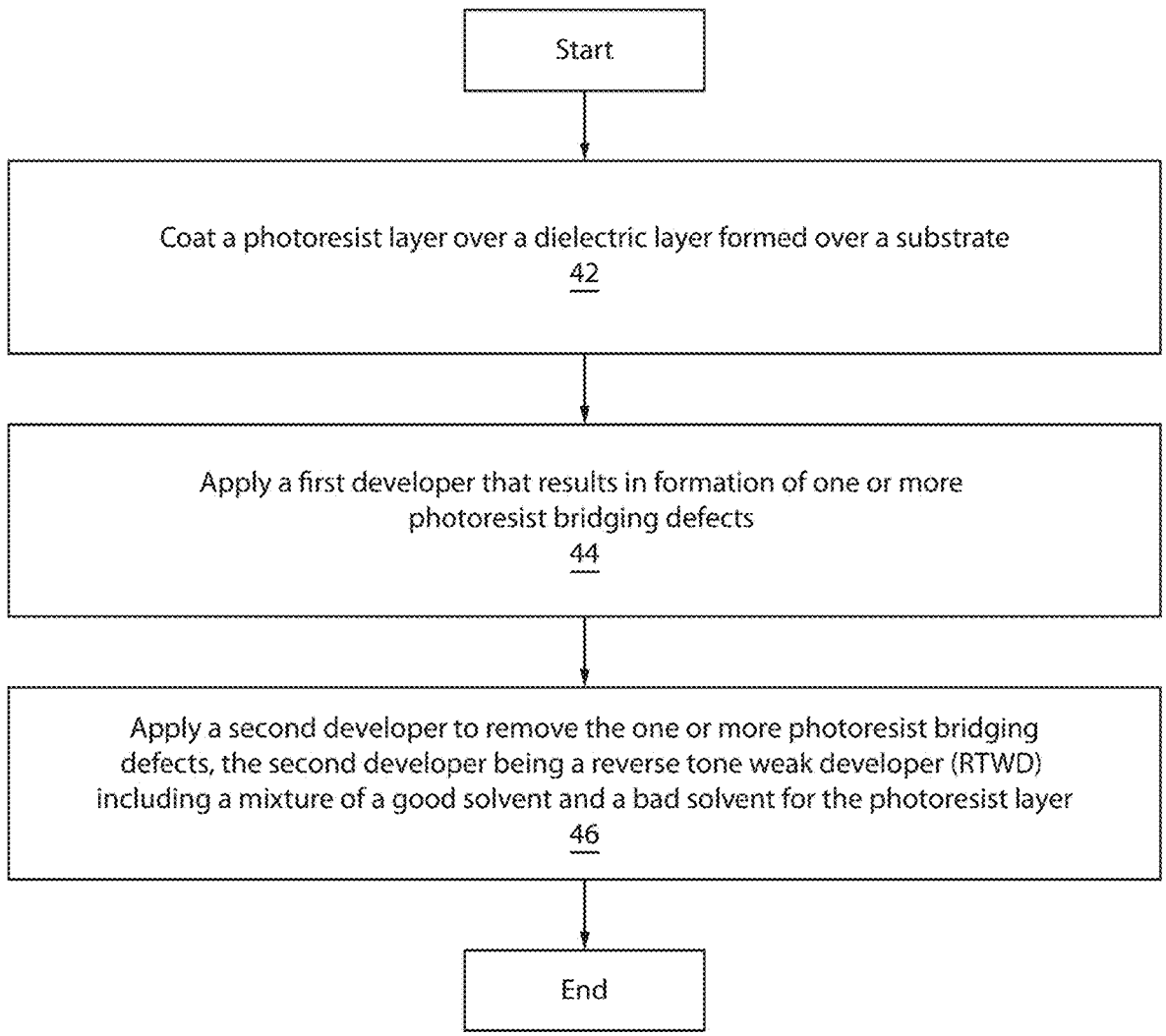
FIG. 4 is a block/flow diagram of a method of removing photoresist bridging defects by a two-step develop process, where the second step includes applying a mixture of good solvent and bad solvent, in accordance with the present invention.

FIG. 4 is a block/flow diagram of a method of removing photoresist bridging defects by a two-step develop process, where the second step includes applying a mixture of good solvent and bad solvent, in accordance with the present invention.

At block 42, coat a photoresist layer over a dielectric layer formed over a substrate.

At block 44, apply a first developer that results in formation of one or more photoresist bridging defects.

At block 46, apply a second developer to remove the one or more photoresist bridging defects, the second developer being a reverse tone weak developer (RTWD) including a mixture of a good solvent and a bad solvent for the photoresist layer.

The advantages of the RTWD process include that it is compatible with standard semiconductor process tools so that it can be integrated easily to the lithography process, the solvent is lower cost compared with photoresist formulation, and it avoids the lengthy process of photoresist R&D and implementation. Thus, the exemplary embodiments of the present invention provide for a two-step develop process where the second develop step is a mixture of good solvent and bad solvent for the polymer to reduce micro-bridging defects. The first step in the develop process is an aqueous base develop step.

It is to be understood that the present invention will be described in terms of a given illustrative architecture; however, other architectures, structures, substrate materials and process features and steps/blocks can be varied within the scope of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical mechanisms (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present embodiments. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of methods of removal of micro-bridging defects in a resist pattern during fabrication (which are intended to be illustrative and not limiting), it is noted that modifications and variations can be made by persons skilled in the art in light of the above teachings. It is therefore to be understood that changes may be made in the particular embodiments described which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for exclusively employing only a two-step develop process in order to fully remove all micro-bridging defects, the method comprising:
   coating a photoresist layer over a dielectric layer formed over a substrate;
   exposing the photoresist layer to light to create photoresist lines;
   applying a first developer, of the two-step develop process, that causes formation of one or more photoresist micro-bridging defects between one or more of the photoresist lines, the first developer configured to dissolve unexposed portions of the photoresist layer from which the photoresist lines are derived; and
   applying a second developer, of the two-step develop process, directly after application of the first developer, without occurrence of rinsing between application of the first and second developers of the two-step develop process, to immediately remove, all at once, only the one or more photoresist micro-bridging defects caused by the application of the first developer to maintain an original profile of the photoresist lines by exclusive application of the two-step develop process only,
   wherein the first developer is an aqueous base developer and the second developer is a reverse tone weak developer (RTWD), the RTWD being a mixture of a first solvent and a second solvent;
   wherein the first solvent is a good solvent for the photoresist lines and the second solvent is a bad solvent for the photoresist lines; and
   wherein the good solvent includes ethyl pyruvate and the bad solvent includes methylisobutylcarbinol.

2. A method for exclusively employing only a two-step develop process in order to fully remove all micro-bridging defects, the method comprising:
   forming a photoresist layer over a substrate;
   exposing the photoresist layer to light to create photoresist lines;
   applying an aqueous base developer, of the two-step develop process, that causes formation of at least one photoresist micro-bridging defect between one or more of the photoresist lines, the aqueous base developer configured to dissolve unexposed portions of the photoresist layer from which the photoresist lines are derived; and
   applying a reverse tone weak developer (RTWD), of the two-step develop process, directly after application of the aqueous base developer, without occurrence of rinsing between application of the aqueous base developer and the reverse tone weak developer of the two-step develop process, to immediately remove, all at once, only the at least one photoresist micro-bridging defect caused by the application of the aqueous base developer to maintain an original profile of the photoresist lines by exclusive application of the two-step develop process only,
   wherein the first developer is an aqueous base developer and the second developer is a reverse tone weak developer (RTWD), the RTWD being a mixture of a first solvent and a second solvent;
   wherein the first solvent is a good solvent for the photoresist lines and the second solvent is a bad solvent for the photoresist lines; and
   wherein the good solvent includes ethyl pyruvate and the bad solvent includes methylisobutylcarbinol.

* * * * *